United States Patent
Okpara

(10) Patent No.: US 12,072,723 B2
(45) Date of Patent: Aug. 27, 2024

(54) TECHNIQUES TO LIMIT OVERSHOOT AFTER DROPOUT CONDITION IN VOLTAGE REGULATORS

(71) Applicant: TEXAS INSTRUMENTS INCORPORATED, Dallas, TX (US)

(72) Inventor: Chizim Okpara, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 172 days.

(21) Appl. No.: 17/828,089

(22) Filed: May 31, 2022

(65) Prior Publication Data

US 2023/0168703 A1    Jun. 1, 2023

Related U.S. Application Data

(60) Provisional application No. 63/283,579, filed on Nov. 29, 2021.

(51) Int. Cl.
  *G05F 1/571*    (2006.01)
(52) U.S. Cl.
  CPC .................................. *G05F 1/571* (2013.01)
(58) Field of Classification Search
  CPC ...................................................... G05F 1/571
  See application file for complete search history.

(56) References Cited

U.S. PATENT DOCUMENTS

| | | | |
|---|---|---|---|
| 8,716,993 B2 * | 5/2014 | Kadanka | G05F 1/565 323/280 |
| 10,008,927 B2 | 6/2018 | Duong | |
| 2014/0354249 A1 | 12/2014 | Kurozo | |
| 2020/0027810 A1 * | 1/2020 | Ho | H01L 23/49827 |
| 2020/0278710 A1 * | 9/2020 | Sankman | G05F 1/575 |
| 2020/0310478 A1 * | 10/2020 | Azevedo | H03F 3/45183 |
| 2021/0080985 A1 | 3/2021 | Shreepathi Bhat | |

OTHER PUBLICATIONS

International Search Report dated Mar. 31, 2023.

* cited by examiner

*Primary Examiner* — Jue Zhang
*Assistant Examiner* — Lakaisha Jackson
(74) *Attorney, Agent, or Firm* — Charles F. Koch; Frank D. Cimino

(57) ABSTRACT

A voltage regulator includes an amplifier having a first amplifier input, a second amplifier input, an amplifier output, and an amplifier supply terminal. A controllable current source has a control terminal coupled to the amplifier output and has a current output coupled to the second amplifier input via a feedback path. A voltage dropout detector includes a voltage dropout detector input and a voltage dropout detector output. The voltage dropout detector input is coupled to the current output. A current bias boost circuit includes a current bias boost input and a current bias boost output. The current bias boost input is coupled to the voltage dropout detector output, and the current bias boost output is coupled to the amplifier supply terminal.

20 Claims, 9 Drawing Sheets

TECHNIQUES TO LIMIT OVERSHOOT AFTER DROPOUT CONDITION IN VOLTAGE REGULATORS

CROSS-REFERENCE TO RELATED APPLICATION

This Application claims the benefit of U.S. Provisional Application No. 63/283,579, filed on Nov. 29, 2021, the contents of which are hereby incorporated by reference in their entirety.

BACKGROUND

A voltage regulator is an electrical circuit that is designed to receive an input voltage and transform the input voltage to deliver a substantially constant output voltage based on the input voltage. Voltage regulators are found in devices such as computer power supplies where they stabilize the DC voltages used by the processor and other elements. Voltage regulators can also be found in automobile electronics, industrial electronics, or other applications, and in general provide stable voltages that are used to power integrated circuits or other components that utilize a constant voltage.

SUMMARY

A voltage regulator includes an amplifier having a first amplifier input, a second amplifier input, an amplifier output, and an amplifier supply terminal. A controllable current source has a control terminal coupled to the amplifier output and has a current output coupled to the second amplifier input via a feedback path. A voltage dropout detector includes a voltage dropout detector input and a voltage dropout detector output. The voltage dropout detector input is coupled to the current output. A current bias boost circuit includes a current bias boost input and a current bias boost output. The current bias boost input is coupled to the voltage dropout detector output, and the current bias boost output is coupled to the amplifier supply terminal.

An electronic system includes a power supply configured to provide a power supply voltage, a load circuit configured to operate at a load voltage, and a voltage regulator arranged between the power supply and the load circuit. The load voltage is different than the power supply voltage. The voltage regulator is configured to receive an input voltage and is configured to output an output voltage. The voltage regulator includes an amplifier having a first amplifier input, a second amplifier input, an amplifier output, and an amplifier supply terminal. The amplifier supply terminal is coupled to the power supply. A controllable current source transistor has a control terminal coupled to the amplifier output and has a transistor output coupled to the second amplifier input via a feedback path. The transistor output is also coupled to the load circuit. A voltage dropout detector includes a voltage dropout detector input and a voltage dropout detector output, wherein the voltage dropout detector input is coupled to the transistor output. A current bias boost circuit includes a current bias boost input and a current bias boost output. The current bias boost input is coupled to the voltage dropout detector output and the current bias boost output is coupled to the amplifier supply terminal.

A method is also provided. In the method, an input supply voltage, which has an input voltage level, is received at an amplifier. An output voltage, which has an output voltage level that differs from the input voltage level, is output from the amplifier based on the input supply voltage. The method detects whether a voltage dropout condition exists by determining whether the output voltage level drops by a first particular voltage threshold or whether the output voltage level has a voltage overshoot greater than a second particular voltage threshold. Based on whether the voltage dropout condition exists, a current bias boost signal is selectively provided to the amplifier.

DETAILED DESCRIPTION

The drawings are not drawn to scale.

Figure 1:
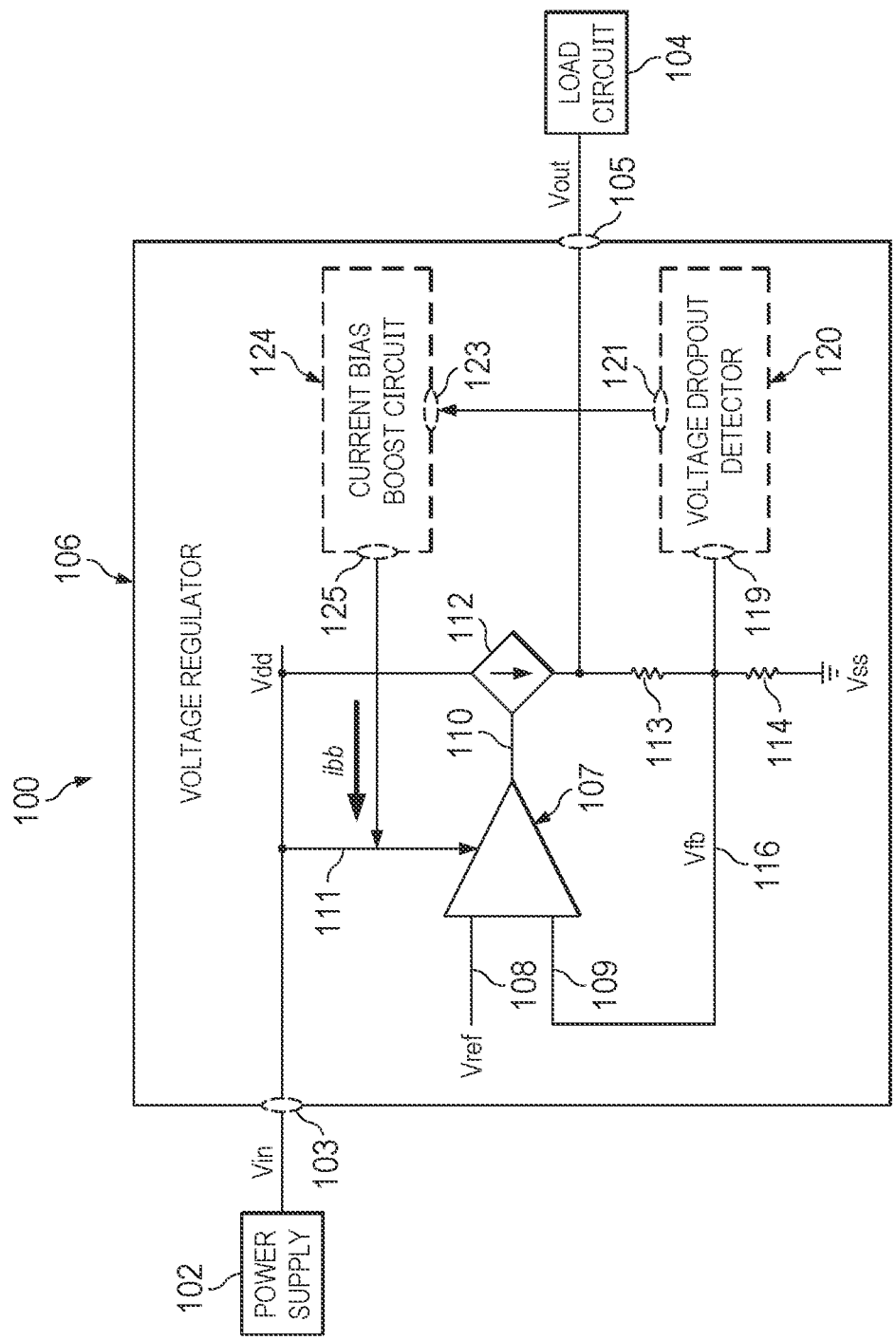
FIG. 1 is a block diagram of an electronic system including a voltage regulator in accordance with some examples.

FIG. 1 depicts an electronic system 100 in accordance with some examples. The electronic system 100 includes a power supply 102 and a load circuit 104. A voltage regulator 106 is arranged between the power supply 102 and the load circuit 104. The voltage regulator 106 has an input 103 coupled to an output of the power supply 102 and an output 105 coupled to the load circuit 104.

The voltage regulator 106 is configured to receive an input voltage Vin on the input 103, and transform the input voltage into an output voltage Vout provided on the output 105. For example, in some cases the power supply 102 can be a battery that delivers an input voltage of approximately 14 Volts, and the load circuit 104 can be an integrated circuit that operates at approximately 5 Volts, so the voltage regulator 106 transforms the 14 Volt input voltage to a 5 Volt output voltage to power the integrated circuit. Of course, this example with a 14 volt input and 5 voltage output is merely an example, and the input voltage and output voltage can have other various values depending on the implementation.

In ideal cases, the output voltage Vout would remain constant in time even when there are slowly-varying or rapidly-varying changes in the input voltage Vin. However, in practical cases where the input voltage varies, there are often still corresponding variations in the output voltage. For example, the input voltage may vary due to changes in the power supply itself (e.g., if the power supply is a battery, the battery voltage may decrease as the load circuit consumes power), and/or the input voltage can vary due to changes in the power demands of the load circuit 104 (e.g., if the load circuit has a sudden and significant increase in power draw, the input voltage may briefly "dip" or "drop" in an effort to meet those demands), among others; and these input voltage variations carry through in some regards to the output voltage in an attenuated manner.

To help maintain a relatively constant output voltage over changes in input voltage, the voltage regulator 106 includes an amplifier 107, a controllable current source 112, and a feedback path 116. The amplifier 107 has a first amplifier input 108, a second amplifier input 109, an amplifier output 110, and an amplifier supply terminal 111. The amplifier supply terminal 111 corresponds to the input 103 of the voltage regulator 106. The controllable current source 112 is arranged on a current path extending between the amplifier supply terminal Vdd and a ground terminal Vss, and has a control terminal coupled to the amplifier output 110. First resistor 113 and second resistor 114 are arranged on this current path so a first point (which corresponds to a current output of the controllable current source 112) corresponds to the output 105 of the voltage regulator 106; and a second point on the current path is coupled to the second amplifier input 109 via the feedback path 116.

The amplifier 107 is configured to compare a reference voltage (Vref) on the first amplifier input 108 to a feedback voltage (Vfb) on the second amplifier input 109, and to provide a control signal on the amplifier output 110 based on this comparison. The control signal increases or decreases the amount of current passing through the controllable current source 112, and thereby "tunes" the output voltage Vout on the output 105 to correspond to the reference voltage Vref, usually with some voltage offset. For instance, in an example where initially the reference voltage Vref is set to 5 Volts, the output voltage Vout is 7 Volts, and the feedback voltage Vfb is 6 Volts (due to some voltage drop over the first resistor 113, wherein the voltage drop is determined by the ratio of the first resistor 113 to the second resistor 114). In this instance, the feedback voltage Vfb is greater than the reference voltage Vref, so the amplifier 107 can "tune" the voltage level of the control signal to decrease the current through the controllable current source 112, thereby reducing the output voltage Vout. If the output voltage falls too low (causing the feedback voltage Vfb to drop below the reference voltage Vref), the amplifier 107 will again "tune" the voltage level of the control signal to increase the current through the controllable current source 112 and correspondingly increase the output voltage Vout. Thus, the output voltage Vout is continuously controlled via the feedback path 116 to ideally provide an output voltage that tracks Vref.

Figure 2:
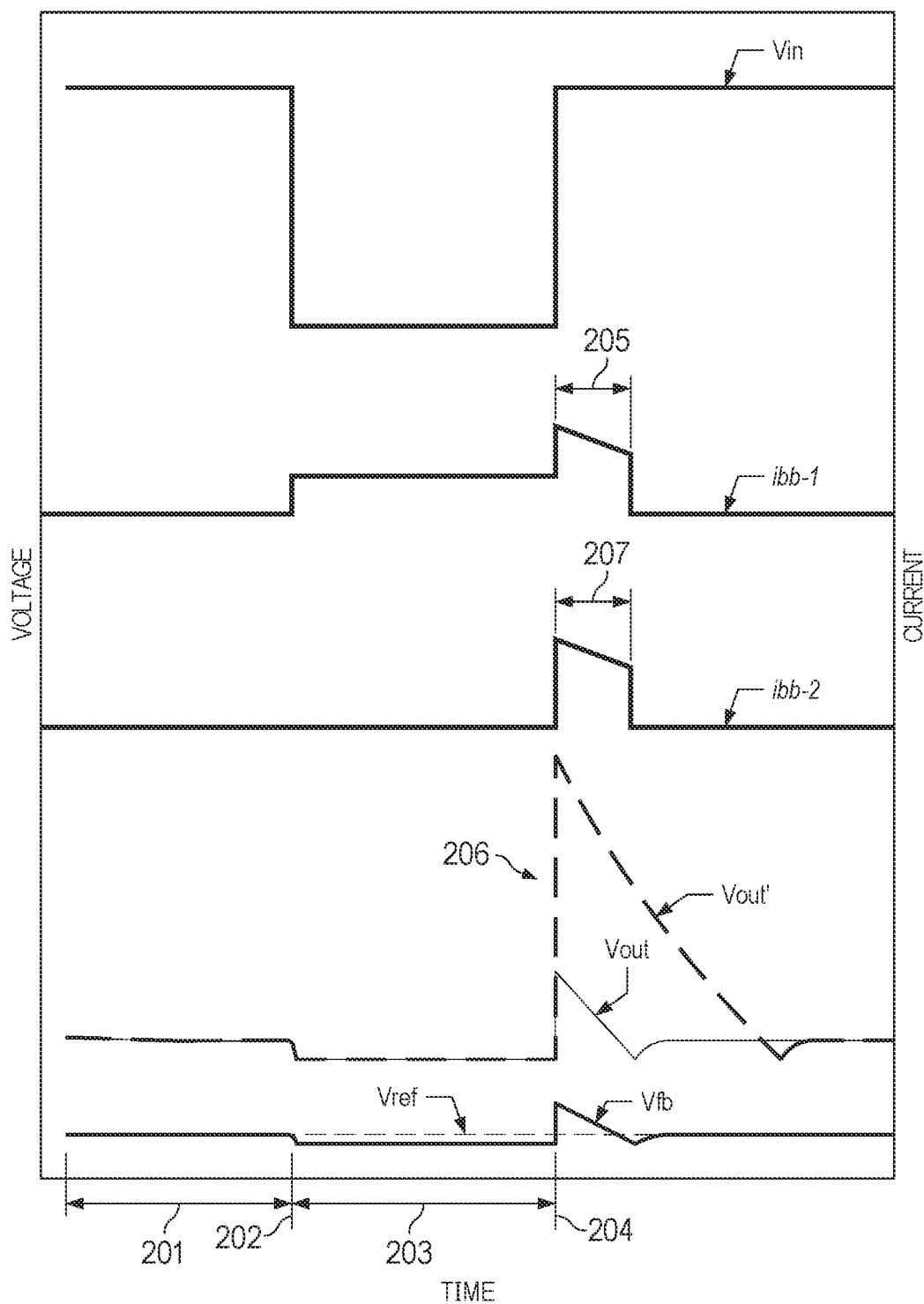
FIG. 2 is a waveform diagram consistent with some examples of the electronic system of FIG. 1.

Some aspects of this description lie in the appreciation that, even with the electronic system making use of this feedback, under some conditions—for example, if the load circuit 104 draws a sudden and significant increase in power—the input voltage Vin may still exhibit brief, uncorrectable "drops". This condition is referred in some contexts as a "voltage dropout condition". FIG. 2 shows an example where the input voltage (Vin) has an initial voltage level during time 201 then "drops" briefly to a second voltage level at time 202 and remains low during time 203. As shown, the output voltage Vout tracks this "drop" somewhat during time 202 and time 203, albeit the output voltage is less than the input voltage because this example portrays a step-down voltage regulator. The voltage dropout itself can be somewhat problematic as, during the voltage dropout condition, the load circuit 104 receives a voltage that is less than expected. However, what may be even more problematic is that at time 204 (immediately following the voltage dropout condition), the output voltage has a large, transient, voltage overshoot 206 when the input voltage rises back to the initial voltage level. If this voltage overshoot 206 has sufficient magnitude, this voltage overshoot can damage devices on the load circuit 104, leading to device failure or long-term reliability concerns.

To limit such overshoot, the voltage regulator of FIG. 1 includes a voltage dropout detector 120 and a current bias boost circuit 124. The voltage dropout detector 120 includes a voltage dropout detector input 119 and a voltage dropout detector output 121, wherein the voltage dropout detector input 119 is coupled to the output of the controllable current source 112. The current bias boost circuit 124 includes a current bias boost input 123 and a current bias boost output 125. The current bias boost input 123 is coupled to the voltage dropout detector output 121 and the current bias boost output 125 is coupled to the amplifier supply terminal 111.

The current bias boost circuit 124 provides a brief current bias boost pulse ibb responsive to the voltage dropout detector 120 detecting the voltage dropout condition. The voltage dropout condition is detected when the output voltage Vout drops below a particular threshold. This current bias boost pulse ibb is provided to the amplifier supply terminal 111, and mitigates voltage overshoots that immediately follow the voltage dropout condition and that are at the output 105 of the voltage regulator 106. FIG. 2 shows the example curves Vout and Vout', wherein Vout' is an example of a voltage overshoot that occurs without a current bias boost pulse being provided by the current bias boost circuit 124, and Vout shows a mitigated output voltage overshoot when the current bias boost circuit 124 provides a current bias boost pulse.

FIG. 2 provides two examples of current bias boost pulses (ibb-1, and ibb-2) that can be provided by various current bias boost circuits.

In the first current bias boost pulse ibb-1, an increase in current is provided at the start of the voltage dropout condition at time 202 and during time 203. Then after the voltage dropout condition ends at 204, the current increases to provide a particular current pulse for a particular time 205.

In contrast, for the second current bias boost pulse ibb-2, the current remains unchanged as a base level during time 203, meanwhile the required corrective bias level is actively monitored and preloaded in a bias boost circuit but not applied to the amplifier. Then, after the voltage dropout condition ends at time 204 during a sufficiently positive supply transient, an output overshoot exceeding a particular threshold is detected, which in turn applies the preloaded bias boost for as long as the output exceeds the particular threshold during variable time 207. Thus, by detecting the voltage dropout condition and by providing a current bias boost pulse to the amplifier supply terminal responsive to the detected voltage dropout condition or output overshoot exceeding the particular threshold, voltage regulators in accordance with this description can limit voltage overshoot and are thereby more reliable than other approaches.

Figure 3:
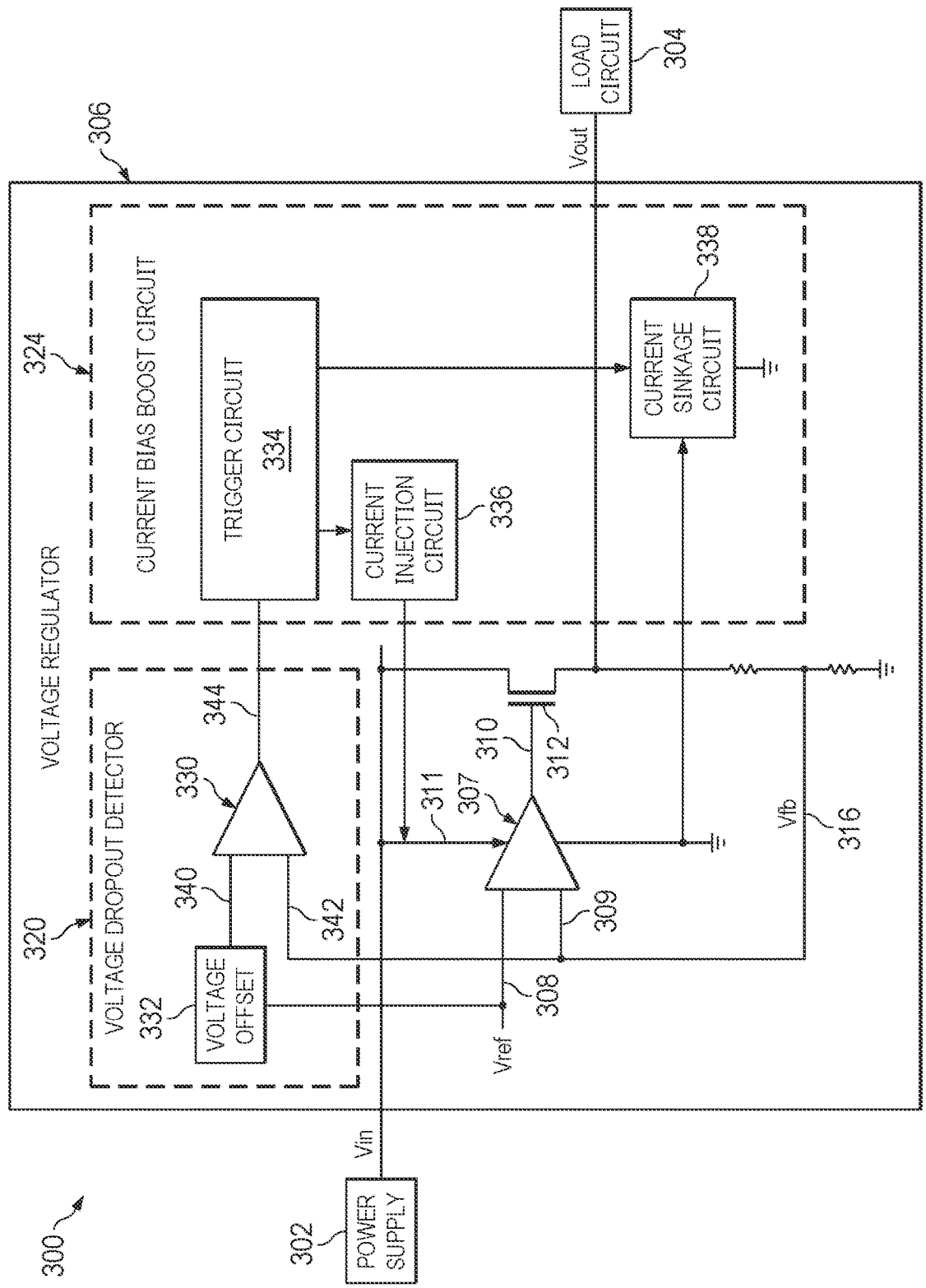
FIG. 3 is a block diagram of an electronic system including a voltage regulator in accordance with some examples.

FIG. 3 shows a more detailed example of an electronic system 300 including a voltage regulator 306 arranged between a power supply 302 and a load circuit 304 according to some examples. Thus, the features described above with regards to FIG. 1 can be consistent with some examples of the electronic system 300 in FIG. 3 (and vice versa). For example, voltage regulator 306 can be an example of voltage regulator 106, amplifier 307 can be an example of amplifier 107, controllable current source transistor 312 can be an example of controllable current source 112, voltage dropout detector 320 can be an example of voltage dropout detector 120, and current bias boost circuit 324 can be an example of current bias boost circuit 124. In FIG. 3, the voltage dropout detector 320 includes a comparator circuit 330 and a voltage offset circuit 332. The current bias boost circuit 324 includes a trigger circuit 334, a current injection circuit 336, and a current sinkage circuit 338, which are operably coupled as shown.

The controllable current source transistor 312 can be an n-channel field effect transistor (NFET), a p-channel field effect transistors (PFET), a bipolar junction transistor (BJT—e.g. NPN or PNP), insulated gate bipolar transistor (IGBT), and/or junction field effect transistor (JFET). The controllable current source transistor 312 may be a depletion mode device, a drain-extended device, an enhancement mode device, a natural transistor or other type of device structure transistor. Furthermore, the controllable current source transistor 312 (as well as any and/or all portions of the voltage regulator 306) may be implemented in/over a monocrystalline silicon substrate, a silicon on insulator (SOI) substrate, a silicon carbide substrate (SiC), a gallium nitride substrate (GaN), or a gallium arsenide substrate (GaAs), among others.

Within the voltage dropout detector 320, the comparator circuit 330 includes a first comparator input 340, a second comparator input 342, and a comparator output corresponding to a voltage dropout detector output 344. The first comparator input 340 is coupled to a first amplifier input 308, and the second comparator input 342 is coupled to the second amplifier input 309. In the illustrated example, the voltage offset circuit 332 is disposed between the first amplifier input 308 and the first comparator input 340, but the voltage offset circuit 332 can alternatively be disposed between the second amplifier input 309 and the second comparator input 342. The voltage offset circuit 332 can include a resistor, diode, transistor, or any other component that induces a particular voltage offset between an input of the amplifier 307 and corresponding input of the comparator circuit 330.

Within the current bias boost circuit 324, the trigger circuit 334 has a trigger input coupled to the voltage dropout detector output 344 and has a trigger output. The current injection circuit 336 is coupled between the trigger circuit output and the amplifier supply terminal 311. The current sinkage circuit 338 is coupled between the trigger circuit output and the amplifier 307.

The current injection circuit 336 is configured to selectively inject a first amount of current into the amplifier supply terminal 311 based on a current injection signal from the trigger circuit 334. The current sinkage circuit 338 is configured to selectively sink a second amount of current from the amplifier 307 while the current injection circuit 336 injects the first amount of current into the amplifier supply terminal 311. The first amount of current and the second amount of current may be equal to one another or may differ from one another depending on exact amplifier topology used. By injecting current into the amplifier supply terminal 311 and concurrently sinking current from the amplifier, the voltage regulator 306 of FIG. 3 provides a well-balanced approach that limits potentially harmful voltage overshoot following a voltage dropout condition.

The voltage dropout detector 320 of FIG. 3 can be implemented in several different ways. In some cases, such as described below with regards to FIGS. 4A-4B (and as described above with current pulse ibb-1 in FIG. 2), an increase in current is provided at the start of the detection of the voltage dropout condition and continues in some manner for a particular time after the voltage dropout condition ends. Thus, in these cases the voltage dropout detector 320 may be referred to as a "voltage dropout entrance detector", as it detects and triggers a current bias boost at the start/entrance of a voltage dropout condition, which can be detected when the voltage output "dips" low by some particular amount. In other cases, such as described below with regards to FIGS. 5A-5B (and as described above with current pulse ibb-2 in FIG. 2), during the start of the dropout condition, the corrective bias level is actively monitored and preloaded in a bias boost circuit, but no additional current bias boost is initially applied to the amplifier. Then, after the voltage dropout condition ends during a sufficiently positive supply transient, an output overshoot exceeding a particular threshold is detected, causing the current bias boost circuit to apply the preloaded bias boost for as long as the output exceeds the particular threshold. Thus, in these other cases the voltage dropout detector 320 may be referred to as a "voltage dropout exit output overshoot detector", as it detects and triggers a current bias boost at the end/exit of a voltage dropout condition.

Figure 4A:
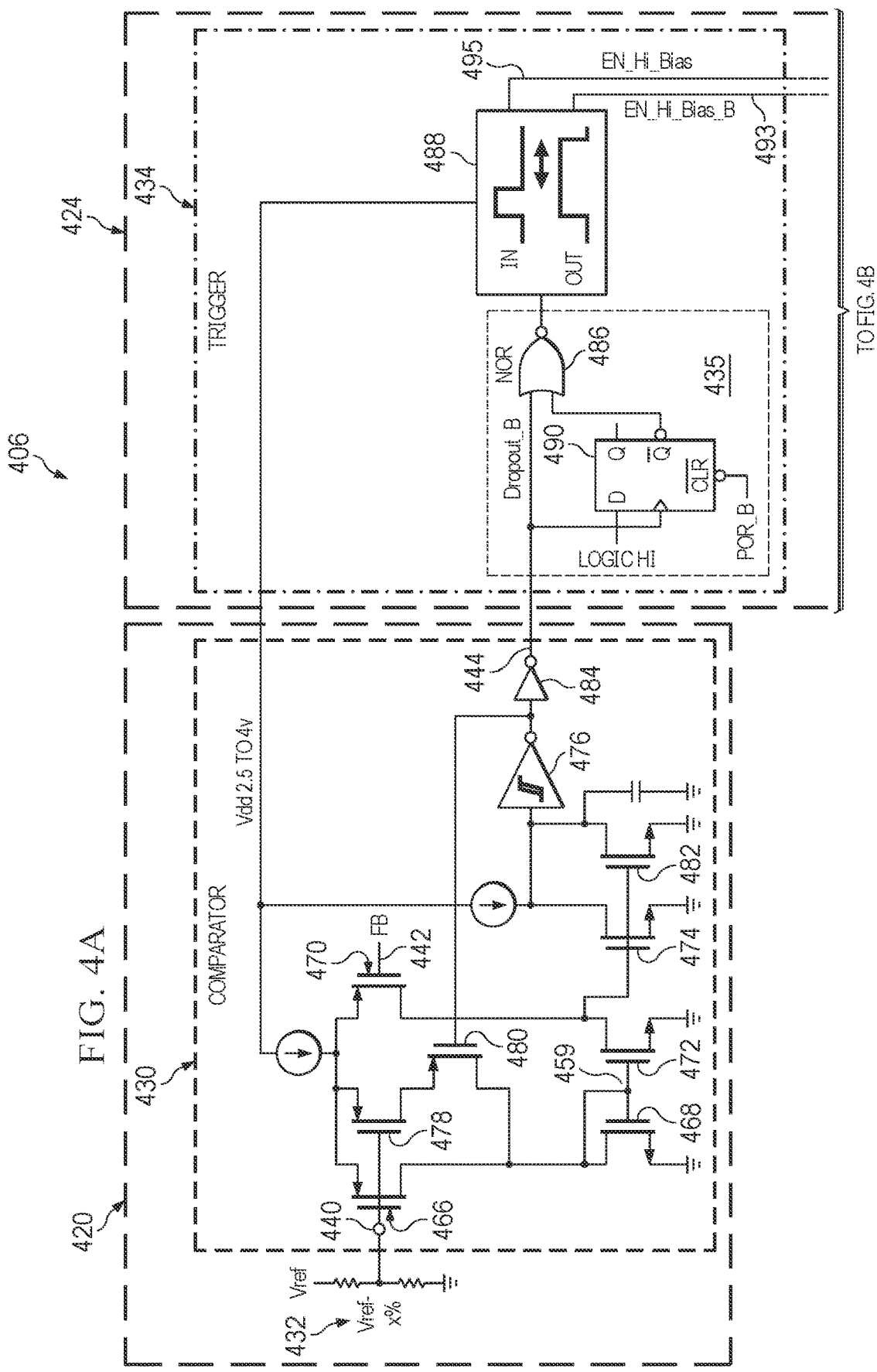
FIGS. 4A-4B are a circuit diagram of a voltage regulator in accordance with some examples.
Figure 4B:
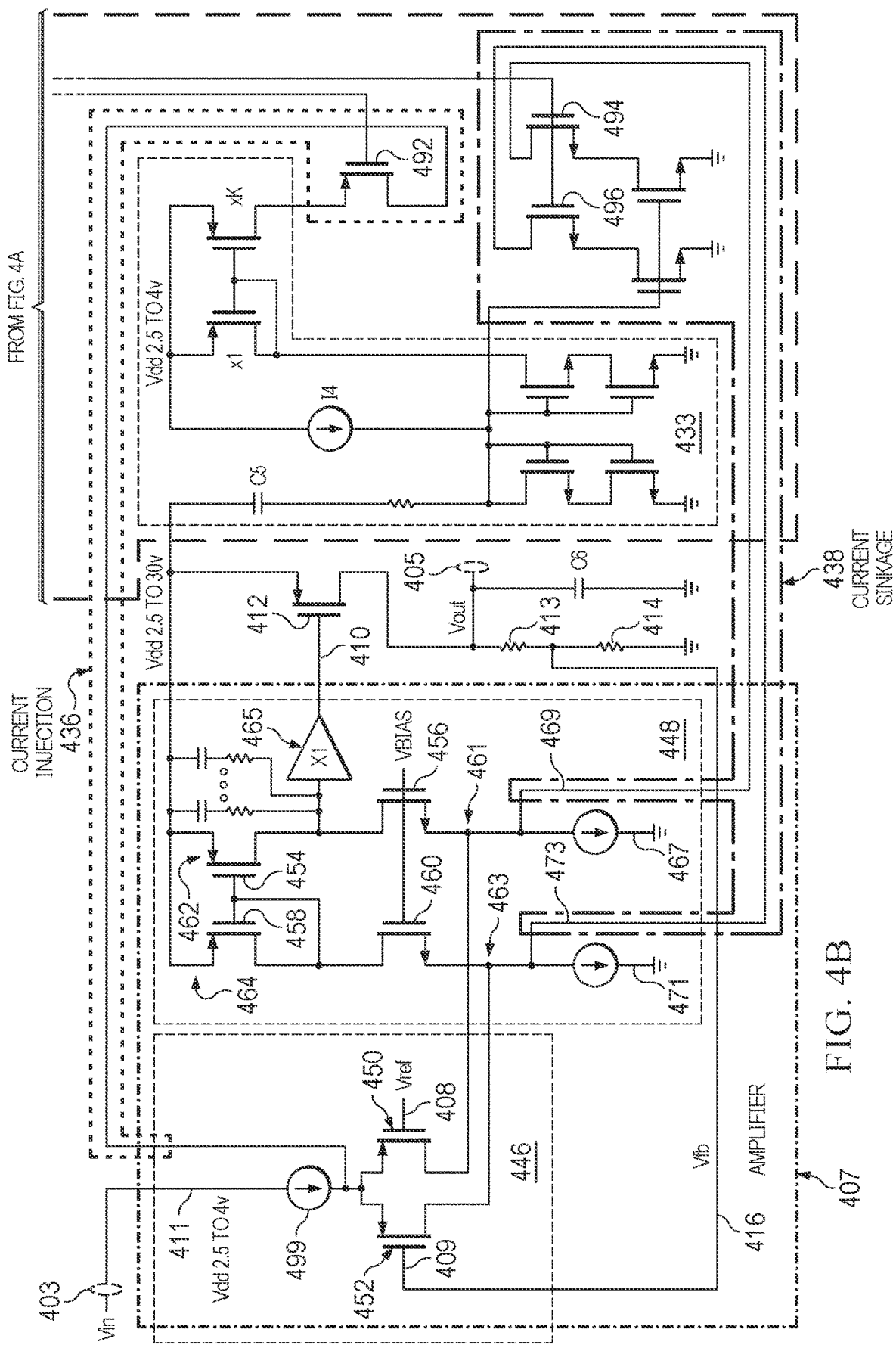

FIGS. 4A-4B show a more detailed circuit schematic of a voltage regulator 406 according to some examples of this description. Like numerals refer to similar features—so amplifier 407 is an example of amplifier 307, comparator 430 is an example of comparator circuit 330, voltage dropout entrance detector 420 is an example of voltage dropout detector 320, and a current bias boost circuit 424 is an example of current bias boost circuit 324, and so on. Within the current bias boost circuit 424, trigger circuit 434 is an example of trigger circuit 334, current injection circuit 436 is an example of current injection circuit 336, and current sinkage circuit 438 is an example of current sinkage circuit 338. In addition to the features of FIG. 3, FIGS. 4A-4B's current bias boost circuit 424 also includes a pre-loading bias boost circuit 433. Further, in addition to the features of FIG. 3, FIGS. 4A-4B's trigger circuit 434 also includes a power-on-reset (POR) dropout disable circuit 435, and a post-dropout sustain circuit 488.

The amplifier 407 includes transistors 450, 452, 454, 456, 458, 460, which are organized into an input stage 446 and an output stage 448. Thus, the input stage 446 includes first input stage transistor 450 and second input stage transistor 452. A first control terminal of the first input stage transistor 450 corresponds to the first amplifier input 408, and a second control terminal of the second input stage transistor 452 corresponds to the second amplifier input 409. Source terminals of the first input stage transistor 450 and the second input stage transistor 452 are coupled to one another at a common node, and the common node corresponds to the amplifier supply terminal 411. The output stage 448 includes a first current path 462 including first and second output stage transistors 454, 456, and a second current path 464 including third and fourth output stage transistors 458, 460. The output stage 448 also includes a first branch point 461 and a second branch point 463. A first current branch 467 and a second current branch 469 split from the first branch point 461, wherein the first branch point 461 corresponds to a drain terminal of the first input stage transistor 450. A third current branch 471 and a fourth current branch 473 split from the second branch point 463, wherein the second branch point 463 corresponds to a drain terminal of the second input stage transistor 452. A buffer 465 includes a buffer input coupled to the first current path 462, and a buffer output corresponding to the amplifier output 410. Bias resistors are also coupled to the buffer input.

The controllable current source transistor 412 has a control terminal (e.g., gate terminal) that is coupled to the amplifier output 410. A feedback path 416 couples the drain of the controllable current source transistor 412 to the second amplifier input 409. First and second resistors 413, 414 are arranged on a current path with the controllable current source transistor 412, and allow for biasing of the output 405 and feedback path 416.

The voltage dropout entrance detector 420 includes a voltage offset circuit 432, and a comparator 430. The voltage offset circuit 432 includes a voltage divider with third and fourth resistors arranged in series. The ratio of the third and fourth resistors is set to provide the desired voltage offset, the voltage offset is chosen to prevent triggering of the dropout operation during normal non-dropout amplifier operation and its value depends on the statistical input offset of the amplifier. For example, if x % is desired to be 50%, then the resistances of the third and fourth resistors are equal. An example x % value is 4%, and the ratio of the third resistor to the fourth resistor to achieve this offset is a top:bottom resistor ratio of 1:24, for example.

The comparator 430 includes transistors 466, 468, 470, 472, 474, 478, 480, and 482; a Schmitt trigger 476, and an inverter 484 that drives a voltage dropout detector output 444. A first comparator transistor 466 on a first current leg has a gate corresponding to the first comparator input 440, and a second comparator transistor 470 on a second current leg has a gate corresponding to the second comparator input 442. The voltage dropout detector output 444 is coupled to an input of the trigger circuit 434.

The voltage offset circuit 432 in combination with the transistors 466, 470, 478, and 480 provide a built-in voltage offset between Vref and Vfb. This built-in voltage offset is used to detect the voltage dropout condition and provide selective current injection and current sinkage for the amplifier 407, and is described in further detail below.

During normal operation (e.g., in the absence of a voltage dropout condition), Vref-x % and Vfb are within some particular range of one another, such that the first current leg with transistors 466, 478, and 480 are "on", such the left current leg (including 466, 468, 478, and 480) has a lower resistance than the right current leg (including 470 and 472). Thus, node 459 is high, which turns transistor 472 more "on", and pulls gate of 474 low. Because 474 is an NFET, this turns transistor 474 more off, and establishes a high voltage on the input of the Schmitt trigger 476. Consequently, this drives output of Schmitt trigger 476 to a low voltage, which leaves transistor 480 on to keep this bias condition in equilibrium. Consequently, due to inverter 484, the voltage dropout detector output 444 is high, and the NOR gate 486 delivers a low output to the sustaining circuit 488. Under this condition, the first trigger output signal 493 is high, such that the current injection circuit 436 (here including a PFET 494) is off; and the second trigger output signal 495 is low, such that the current sinkage circuit 438 (here including NFETs 494, 496) is also off. Thus, during normal operation, the first and second input stage transistors 450, 452 are powered by current source 499 and not any additional current injection from current injection circuit 436 nor any additional current sinkage from current sinkage circuit 438.

When a voltage dropout condition occurs, Vfb can drop to be less than Vref-x %-hysteresis voltage introduced by PFET 478 which is currently on (and thus, Vfb falls outside of the particular range for normal operation), and the second current leg with transistor 470 becomes more strongly "on" than the first current leg with transistors 466 and 468, causing transistor 472 to be less "on" and pulling gate of 474 high (so 474, which is an NFET, is more "on"). This also pulls the input of the Schmitt trigger 476 low and drives output of Schmitt trigger 476 high (e.g., signal "dropout" is also high). This also turns off transistor 480, such that 466 and 468 now have an equal resistance as 470 and 472, thereby completing the built-in voltage offset between a voltage dropout condition and normal operation. This sets up the comparator to exit the dropout state when the Vfb again rises past the Vref-x % threshold. Consequently, during the voltage dropout condition, the voltage dropout detector output 444 is low, and the NOR gate 486 potentially delivers a high output to the sustaining circuit 488. Because the power-on-reset (POR) dropout disable circuit 490 outputs a logical 1 only during a power on reset state and outputs a logical 0 at other times, the NOR gate 486 delivers a high output during voltage dropout condition other than those that would occur during power on reset. Circuit 490 disables the trigger circuit until after the first output power on, at which point the output of the circuit 490 is now continuously logic 0. Thus, under such voltage dropout conditions, the first trigger output signal 493 is low, such that the current injection circuit (here PFET 492) is on; and the second trigger output signal 495 is high, such that the current sinkage circuit (here NFETs 494, 496) is also on. The sustaining circuit 488 holds the first and second trigger output signals with these voltages for a particular time after the voltage dropout entrance detector 420 has signaled an end to detection of the voltage dropout condition, thereby providing current injection into the amplifier supply terminal 411 and concurrently providing current sinkage from the second current branch 469 and fourth current branch 473. In this way, the voltage dropout entrance detector 420 and current bias boost circuit 424 mitigate voltage overshoot arising immediately after voltage dropout conditions.

Figure 5A:
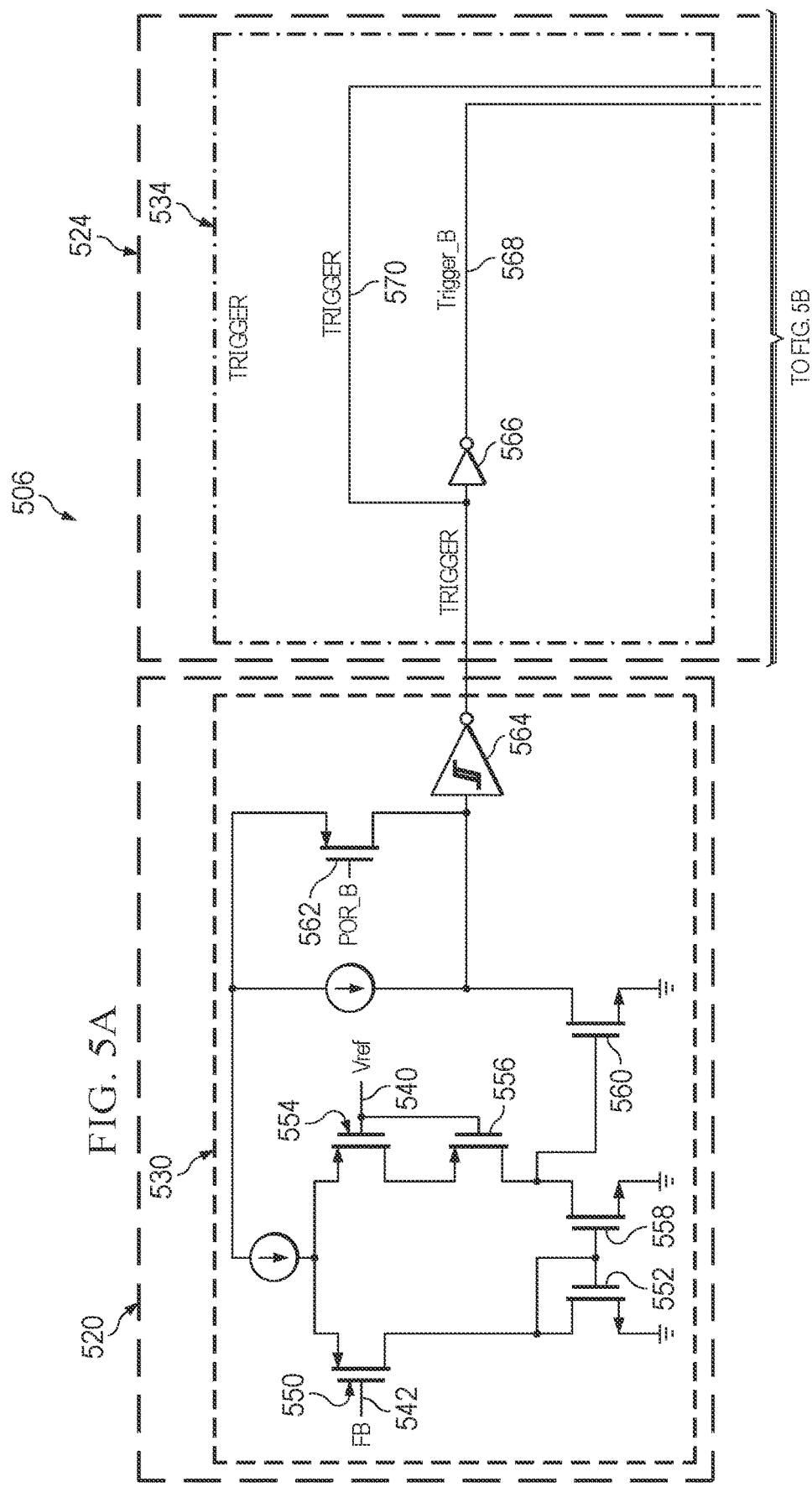
FIGS. 5A-5B are a circuit diagram of another a voltage regulator in accordance with some examples.
Figure 5B:
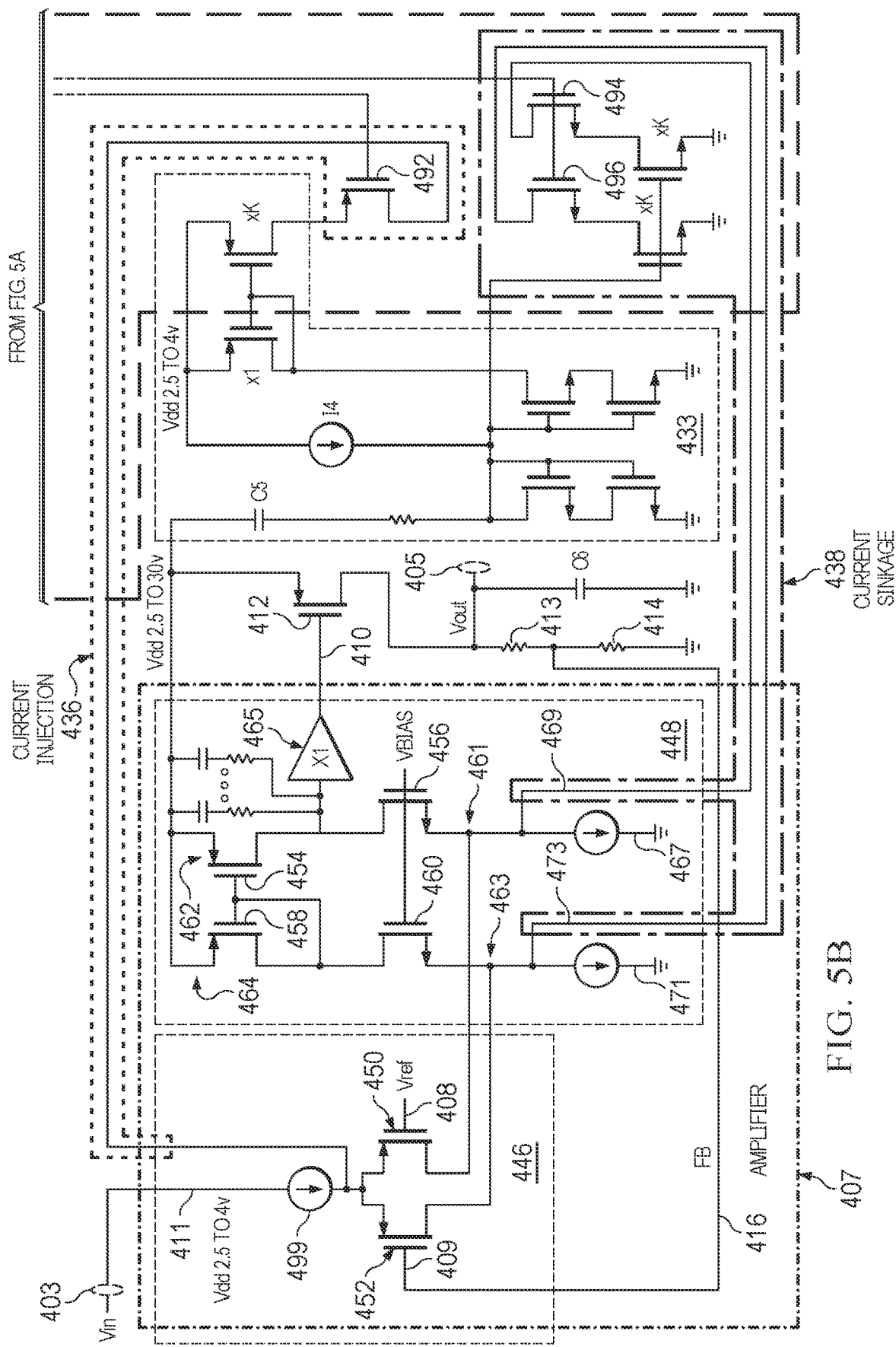

FIGS. 5A-5B are a more detailed circuit schematic of a voltage regulator 506 according to some examples of this description. Again, like numerals refer to similar features— so amplifier 407 is an example of amplifier 307, voltage dropout exit output overshoot detector 520 is an example of voltage dropout detector 320, and a current bias boost circuit 524 is an example of current bias boost circuit 324, and so on. Within the current bias boost circuit 524, trigger circuit 534 is an example of trigger circuit 334, current injection circuit 436 is an example of current injection circuit 336, and current sinkage circuit 438 is an example of current sinkage circuit 338.

The amplifier 407 includes transistors 450, 452, 454, 456, 458, 460, which are organized into an input stage 446 and an output stage 448, and are the same as described above with regards to FIGS. 4A-4B. The controllable current source transistor 412, and feedback path 416 are also the same as described above in FIGS. 4A-4B.

The voltage dropout exit output overshoot detector 520 includes a comparator with a built-in voltage offset between the first comparator input 540 and second comparator input 542. For example, the voltage dropout exit output overshoot detector 520 includes transistors 550, 552, 554, 556, 558, 560, and 562; and a Schmitt trigger 564. The trigger circuit 534 includes an inverter 566, and provides a first trigger output signal 568 to the current injection circuit 536 and provides a second trigger output signal 570 to the current sinkage circuit 538.

In FIGS. 5A-5B, the built-in voltage offset between Vref and Vfb arises due to the fact there is a first voltage drop over 550 on first current leg and a second voltage drop over 554 and 556 on second current leg. For example, because transistor 550 is only a single transistor and 554 and 556 are two transistors in series with one another, 554 and 556 represent a higher resistance than 550; and a larger voltage drop will occur over 554 and 556 to give way to a built-in voltage offset.

During normal operation (e.g., in the absence of a voltage dropout condition), Vref and Vfb are within some particular range of one another, and that transistor 550 is "on", so the gate of 558 is high, which turns transistor 558 more "on", and pulls gate of 560 low. Because 560 is an NFET, this turns transistor 560 more off, and establishes a high voltage on the input of the Schmitt trigger 564. Consequently, this drives output of Schmitt trigger 564 to a low voltage. Thus, under this condition, the first trigger output signal 568 is high, such that the current injection circuit 436 (here including a PFET 494) is off; and the second trigger output signal 570 is low, such that the current sinkage circuit 438 (here including NFETs 494, 496) is also off. Thus, during normal operation, the first and second input stage transistors 450, 452 are powered by current source 499 and not any additional current injection from current injection circuit 436 nor any additional current sinkage from current sinkage circuit 438.

After a voltage dropout condition occurs, and the supply voltage starts a rising during an exit from a dropout condition, the supply voltage would usually rise quickly enough to cause an overshoot at the voltage regulator output. The designed offset at the voltage dropout exit output overshoot detector 520 is setup to trigger when the FB input 542 rises past the VREF input 540 by the particular comparator offset. When the regulator output voltage overshoots past a particular threshold, the FB input 542 is greater than VREF plus the particular comparator offset, the second comparator current leg with transistors 554, 556 is more turned "on" than the first comparator current leg with transistors 550, 552. Transistor 552 is turned off, which turns off transistor 558 (so 560, which is an NFET, is more "on"). This also pulls the input of the Schmitt trigger 564 low and drives output of Schmitt trigger 564 high. Thus, under such voltage dropout conditions, the first trigger output signal 568 is low, such that the current injection circuit (here PFET 492) is on; and the second trigger output signal 570 is high, such that the current sinkage circuit (here NFETs 494, 496) is also on. Thus, the voltage dropout exit output overshoot detector 520 and trigger circuit 534 bias the first trigger output signal 568 and second trigger output signal 570 to provide current injection into the amplifier supply terminal 411 and concurrently providing current sinkage from the second current branch 469 and fourth current branch 473 during voltage dropout conditions. These trigger circuit turned on transistors 494, 496 and 492 to activate a pre-loaded bias which monitored rate of dropout exit before the overshoot condition occurred in order to quickly apply a bias boost when needed. In this way, the voltage dropout exit output overshoot detector 520 and current bias boost circuit 524 mitigate voltage overshoot arising immediately after voltage dropout conditions.

Figure 6:
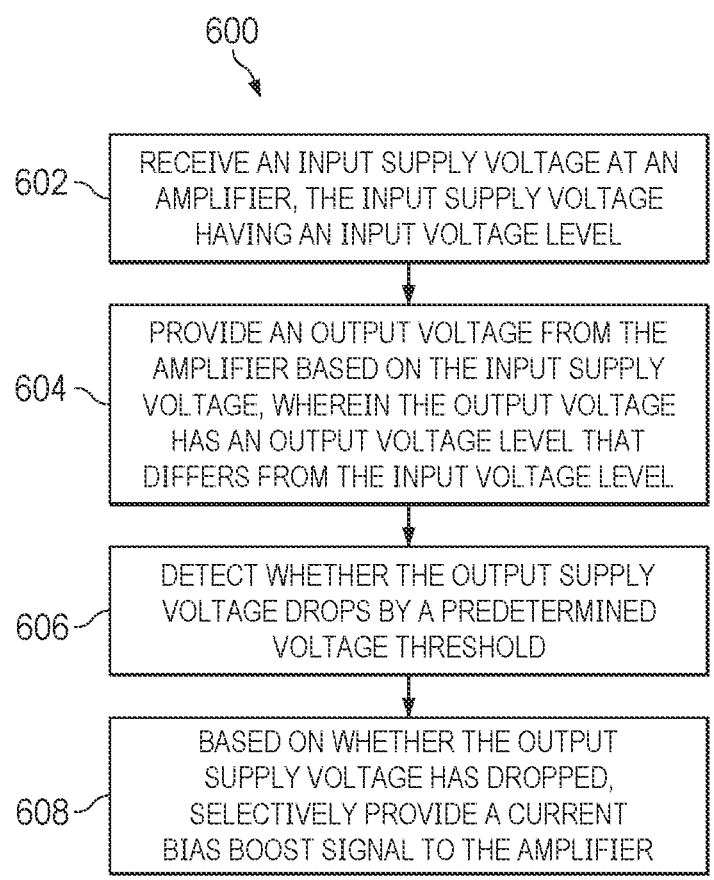
FIG. 6 is a flow diagram in accordance with some methods of this description.

FIG. 6 is a flow-chart depicting a method in accordance with some examples.

At operation 602, an input supply voltage is received at an amplifier. The input supply voltage has an input voltage level.

At operation 604, an output voltage is provided from the amplifier based on the input supply voltage. The output voltage has an output voltage level that differs from the input voltage level.

At operation 606, the method detects whether the input supply voltage drops by a particular voltage threshold. In some cases, this can be detected by using a built-in voltage offset included in a voltage dropout detector circuit.

At operation 608, based on whether the input supply voltage has dropped, a current bias boost signal is selectively provided to the amplifier.

Figure 7:
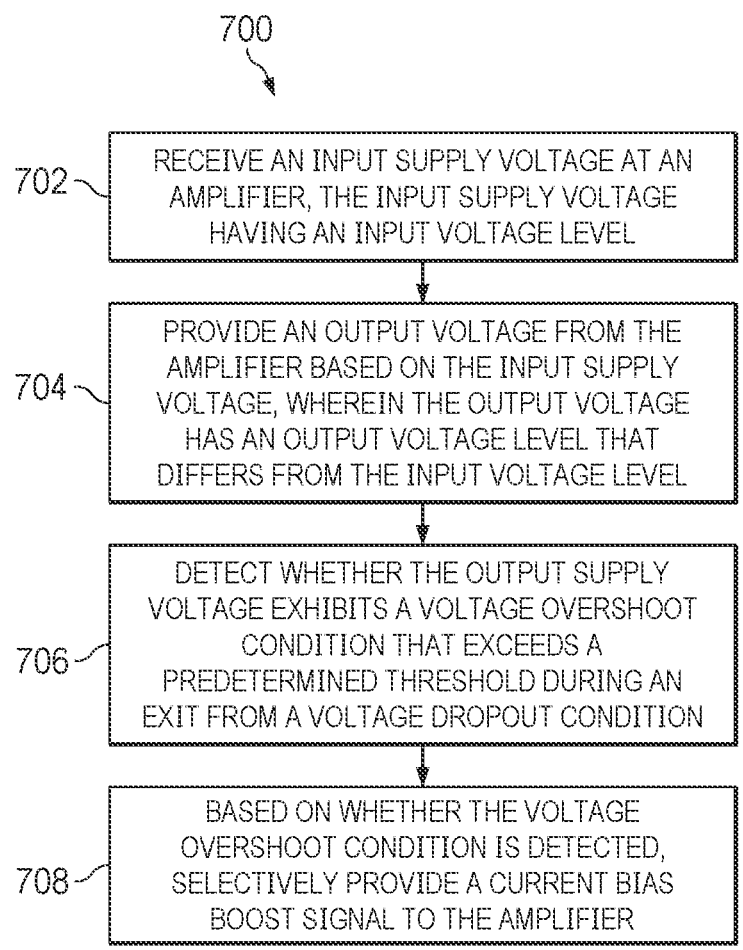
FIG. 7 is a flow diagram in accordance with some methods of this description.

FIG. 7 is a flow-chart depicting another method in accordance with some examples.

At operation 702, an input supply voltage is received at an amplifier. The input supply voltage has an input voltage level.

At operation 704, an output voltage is provided from the amplifier based on the input supply voltage. The output voltage has an output voltage level that differs from the input voltage level.

At operation 706, the method detects whether the output supply voltage exhibits a voltage overshoot condition that exceeds a particular threshold during an exit from a voltage dropout condition.

At operation 708, based on whether the voltage overshoot condition is detected, a current bias boost signal is selectively provided to the amplifier.

The methods are illustrated and described above as a series of operations or events, but the illustrated ordering of such operations or events is not limiting. For example, some operations or events may occur in different orders and/or concurrently with other operations or events apart from those illustrated and/or described herein. Also, some illustrated operations or events are optional to implement one or more aspects or examples of this description. Further, one or more of the operations or events depicted herein may be performed in one or more separate operations and/or phases. In some examples, the methods described above may be implemented in a computer readable medium using instructions stored in a memory.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor, a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of that parameter. Modifications are possible in the described examples, and other implementations are possible, within the scope of the claims.

What is claimed is:

1. A voltage regulator, comprising:
    an amplifier having a first amplifier input, a second amplifier input, an amplifier output, and an amplifier supply terminal;
    a controllable current source having a control terminal coupled to the amplifier output and having a current output coupled to the second amplifier input via a feedback path;
    a voltage dropout detector including a voltage dropout detector input and a voltage dropout detector output, the voltage dropout detector input coupled to the current output; and
    a current bias boost circuit including a current bias boost input and a current bias boost output, the current bias boost input coupled to the voltage dropout detector output, and the current bias boost output coupled to the amplifier supply terminal, wherein the current bias boost circuit includes:
        a trigger circuit coupled to the voltage dropout detector output;
        a current injection circuit coupled to the trigger circuit and the amplifier supply terminal; and
        a current sinkage circuit coupled to the trigger circuit and the amplifier.

2. The voltage regulator of claim 1, wherein the voltage regulator is configured to receive a reference voltage signal on the first amplifier input, is configured to receive a supply voltage on an input of the voltage regulator, and is configured to provide an output voltage on an output of the voltage regulator, wherein the output voltage differs from the supply voltage and is substantially constant over changes in the supply voltage.

3. The voltage regulator of claim 1, wherein the voltage dropout detector comprises:
    a comparator circuit having a first comparator input, a second comparator input, and a comparator output; and
    wherein the first comparator input is coupled to the first amplifier input, the second comparator input is coupled to the second amplifier input, and the comparator output is coupled to the current bias boost input.

4. The voltage regulator of claim 3, wherein:
    the trigger circuit having a trigger input coupled to the comparator output and having a trigger circuit output;
    the current injection circuit coupled between the trigger circuit output and the amplifier supply terminal, the current injection circuit configured to selectively inject a first amount of current into the amplifier supply terminal based on a current injection signal from the trigger circuit; and
    the current sinkage circuit coupled between the trigger circuit output and the amplifier, the current sinkage circuit configured to selectively sink a second amount of current from the amplifier while the current injection circuit is injecting the first amount of current into the amplifier supply terminal.

5. The voltage regulator of claim 4, wherein the current bias boost circuit includes:
    a pre-loading bias boost circuit coupled between the current output and each of the current injection circuit and the current sinkage circuit, the pre-loading bias boost circuit configured to continuously monitor the current output and set a current boost bias level that induces the first amount of current and the second amount of current.

6. The voltage regulator of claim 4, wherein the current bias boost circuit includes:
    a post-dropout sustain circuit configured to receive a voltage dropout signal indicating a voltage dropout condition, and further configured to sustain a boosted current bias level for a delay after the voltage dropout condition has ended.

7. The voltage regulator of claim 4, further comprising:
    a power-on reset dropout disable circuit configured to disable the trigger circuit until after the voltage regulator is initially powered on.

8. The voltage regulator of claim 1, wherein the amplifier comprises an input stage, the input stage comprising:
    a first input stage transistor, wherein a first control terminal of the first input stage transistor corresponds to the first amplifier input; and
    a second input stage transistor, wherein a second control terminal of the second input stage transistor corresponds to the second amplifier input; and
    wherein source terminals of the first input stage transistor and the second input stage transistor are coupled to one another at a common node, and the common node corresponds to the amplifier supply terminal.

9. The voltage regulator of claim 8, wherein the amplifier includes an output stage, the output stage comprising:
    a first branch point from which a first branch and a second branch split from a first drain terminal of the first input stage transistor;

a second branch point from which a third branch and a fourth branch split from a second drain terminal of the second input stage transistor; and a buffer including a buffer input coupled to the first branch point and a buffer output coupled to the amplifier output and coupled to the control terminal of the controllable current source.

10. The voltage regulator of claim 9, wherein the voltage dropout detector comprises:

a comparator circuit having a first comparator input, a second comparator input, and a comparator output, wherein the first comparator input is coupled to the first amplifier input and the second comparator input is coupled to the second amplifier input.

11. The voltage regulator of claim 10, wherein the current bias boost circuit comprises:

a trigger circuit having a trigger circuit input coupled to the comparator output and having a trigger circuit output;

a current injection circuit including a current injection circuit input coupled to the trigger circuit output and a current injection circuit output coupled to the common node; and a current sinkage circuit including a first current sinkage transistor coupled to the trigger circuit output and either the first branch or the second branch, and a second current sinkage transistor coupled to the trigger circuit output and either the third branch or the fourth branch.

12. The voltage regulator of claim 1, wherein the current bias boost circuit is configured to provide a current bias boost pulse at a first current level responsive to the voltage dropout detector detecting a voltage dropout condition, and the current bias boost circuit is configured to provide the current bias boost pulse at a second current level that is greater than the first current level when an end of the voltage dropout condition occurs.

13. The voltage regulator of claim 12, wherein the current bias boost circuit applies the current bias boost pulse for a time after the end of the voltage dropout condition.

14. The voltage regulator of claim 1, wherein the current bias boost circuit is configured to provide a current bias boost pulse with an increased current level only when an end of a voltage dropout condition occurs and not when the voltage dropout condition is initially present.

15. An electronic system, comprising a power supply configured to provide a power supply voltage;

a load circuit configured to operate at a load voltage, the load voltage being different than the power supply voltage;

a voltage regulator arranged between the power supply and the load circuit, the voltage regulator configured to receive an input voltage and to provide an output voltage, the voltage regulator comprising:

an amplifier having a first amplifier input, a second amplifier input, an amplifier output, and an amplifier supply terminal, the amplifier supply terminal coupled to the power supply;

a controllable current source transistor having a control terminal coupled to the amplifier output and having a transistor output coupled to the second amplifier input via a feedback path, the transistor output coupled to the load circuit;

a voltage dropout detector including a voltage dropout detector input and a voltage dropout detector output, the voltage dropout detector input coupled to the transistor output; and a current bias boost circuit including a current bias boost input and a current bias boost output, the current bias boost input coupled to the voltage dropout detector output, and the current bias boost output coupled to the amplifier supply terminal, wherein the current bias boost circuit includes:

a trigger circuit coupled to the voltage dropout detector output;

a current injection circuit coupled to the trigger circuit and the amplifier supply terminal; and a current sinkage circuit coupled to the trigger circuit and the amplifier.

16. The electronic system of claim 15, wherein the power supply is a battery, and the load circuit is an integrated circuit.

17. A method, comprising:

receiving an input supply voltage at an amplifier, the input supply voltage having an input voltage level;

providing an output voltage from the amplifier based on the input supply voltage, wherein the output voltage has an output voltage level that differs from the input voltage level;

detecting whether a voltage dropout condition exists by determining whether the output voltage level drops by a first voltage threshold or whether the output voltage level has a voltage overshoot greater than a second voltage threshold; and based on whether the voltage dropout condition exists, selectively providing a current bias boost signal, wherein in response to the current bias boost signal, a source current is provided to the amplifier and a sink current is provided from the amplifier while the source current is provided to the amplifier.

18. The method of claim 17, wherein the source current increases to a first current level when the voltage dropout condition exists, and increases to a second current level that is greater than the first current level when the voltage dropout condition ends.

19. The method of claim 18, wherein the second current level is applied for a particular time after the voltage dropout condition ends.

20. The method of claim 17, wherein the source current remains at a base current level while the voltage dropout condition exists, and increases to a second current level that is greater than the base current level when the voltage dropout condition ends.

* * * * *